(12) United States Patent
Hauer et al.

(10) Patent No.: US 8,648,665 B2
(45) Date of Patent: Feb. 11, 2014

(54) IMPEDANCE-MATCHING CIRCUITS FOR MULTI-OUTPUT POWER SUPPLIES DRIVING $CO_2$ GAS-DISCHARGE LASERS

(75) Inventors: Frederick W. Hauer, Windsor, CT (US); Joel Fontanella, Tolland, CT (US); Patrick T. Tracy, Bolton, CT (US)

(73) Assignee: Coherent, Inc., Santa Clara, CA (US)

( * ) Notice: Subject to any disclaimer, the term of this patent is extended or adjusted under 35 U.S.C. 154(b) by 513 days.

(21) Appl. No.: 13/029,953

(22) Filed: Feb. 17, 2011

(65) Prior Publication Data

US 2012/0086519 A1 Apr. 12, 2012

Related U.S. Application Data

(60) Provisional application No. 61/390,516, filed on Oct. 6, 2010.

(51) Int. Cl.
*H03H 7/38* (2006.01)

(52) U.S. Cl.
USPC ............................................ 333/17.3; 333/33

(58) Field of Classification Search
USPC ...................................... 333/32, 33, 17.3, 125
See application file for complete search history.

(56) References Cited

U.S. PATENT DOCUMENTS

| | | |
|---|---|---|
| 4,013,974 A | 3/1977 | Quine |
| 4,311,965 A | 1/1982 | Jones |
| 4,350,958 A | 9/1982 | Pagnamenta |
| 4,774,481 A | 9/1988 | Edwards et al. |
| 4,806,944 A | 2/1989 | Jacomb-Hood |
| 4,885,557 A | 12/1989 | Barczys |
| 5,008,894 A | 4/1991 | Laakmann |
| 5,040,184 A | 8/1991 | Murray |
| 5,123,028 A | 6/1992 | Hobart et al. |
| 5,264,810 A | 11/1993 | Sager et al. |
| 5,311,196 A | 5/1994 | Hanson et al. |
| 5,434,881 A | 7/1995 | Welsch et al. |
| 5,543,751 A | 8/1996 | Stedman et al. |
| 5,602,865 A | 2/1997 | Laakmann |
| 5,712,592 A | 1/1998 | Stimson et al. |
| 5,771,026 A | 6/1998 | Stengel, Jr. |

(Continued)

FOREIGN PATENT DOCUMENTS

| | | |
|---|---|---|
| EP | 0418538 A1 | 3/1991 |
| EP | 0858124 A1 | 8/1998 |

(Continued)

OTHER PUBLICATIONS

International Search Report and Written Opinion received for PCT Patent Application No. PCT/US2010/037910, mailed on Mar. 22, 2011, 18 pages.

(Continued)

*Primary Examiner* — Stephen Jones
(74) *Attorney, Agent, or Firm* — Morrison & Foerster LLP

(57) ABSTRACT

Electrical apparatus for connecting a radio frequency power-supply having two outputs to a load includes two radio frequency transmission-lines, each one connected to a corresponding power-supply output. A transformer arrangement connects the two transmission-lines to the load. Each transmission-line includes a series-connected pair of twelfth-wave transmission-line sections. The series-connection between the twelfth wave transmission-line sections in one transmission line is connected to the series-connection between the twelfth-wave transmission-line sections in the other by a device having an adjustable impedance.

18 Claims, 12 Drawing Sheets

(56) References Cited

U.S. PATENT DOCUMENTS

| | | | |
|---|---|---|---|
| 6,018,280 | A | 1/2000 | Makanvand |
| 6,097,267 | A | 8/2000 | Hampel |
| 6,323,742 | B1 | 11/2001 | Ke |
| 6,384,540 | B1 | 5/2002 | Porter et al. |
| 6,489,859 | B1 | 12/2002 | Tahara et al. |
| 6,559,737 | B1 | 5/2003 | Nagra et al. |
| 6,778,037 | B1 | 8/2004 | Salmela et al. |
| 6,788,722 | B1 | 9/2004 | Kennedy et al. |
| 6,803,837 | B2 | 10/2004 | Ishida et al. |
| 6,999,490 | B2 | 2/2006 | Kennedy et al. |
| 7,164,903 | B1 | 1/2007 | Cliff et al. |
| 7,233,217 | B2 | 6/2007 | Phillips et al. |
| 7,514,994 | B2 | 4/2009 | Fraysse |
| 7,540,779 | B2 | 6/2009 | Papanide et al. |
| 7,558,308 | B2 | 7/2009 | Shackleton et al. |
| 7,605,673 | B2 | 10/2009 | Robotham et al. |
| 7,755,452 | B2 | 7/2010 | Knickerbocker et al. |
| 2010/0316084 | A1 | 12/2010 | Hauer et al. |

FOREIGN PATENT DOCUMENTS

| | | | |
|---|---|---|---|
| EP | 1939980 | A1 | 7/2008 |
| JP | 4-23605 | A | 1/1992 |
| JP | 7-131096 | A | 5/1995 |
| JP | 11-97952 | A | 4/1999 |
| JP | 2001-512619 | A | 8/2001 |
| JP | 2005-130013 | A | 5/2005 |
| WO | 2009/060213 | A1 | 5/2009 |

OTHER PUBLICATIONS

International Preliminary Report on Patentability received for PCT Patent Application No. PCT/US2010/037910, mailed on Dec. 22, 2011, 12 pages.

Notice of Allowance received for U.S. Appl. No. 13/090,885, mailed on Jan. 19, 2012, 19 pages.

International Search Report and Written Opinion received for PCT Patent Application No. PCT/US2011/052740, mailed on Jan. 31, 2012, 13 pages.

Fukuda et al., "A 900/1500/2000-MHz Triple-Band Reconfigurable Power Amplifier Employing RF-MEMS Switches", IEEE MTT-S International Microwave Symposium, 2005, pp. 657-660.

Notice of Allowance received for U.S. Appl. No. 13/090,885, mailed on Feb. 23, 2012, 7 pages.

Notice of Allowance received for U.S. Appl. No. 11/711,192, mailed on Apr. 15, 2010, 6 pages.

Non Final Office Action received for U.S. Appl. No. 12/482,341, mailed on Sep. 27, 2010, 12 pages.

Notice of Allowance received for U.S. Appl. No. 12/482,341, mailed on Nov. 19, 2010, 6 pages.

Hauer, Fredrick W., Unpublished U.S. Appl. No. 12/786,199, filed May 24, 2010, titled as Impedance-Matching Transformers for Rf Driven Co2 Gas Discharge Lasers, 23 pages.

Bramham, P., "A Convenient Transformer for Matching Co-Axial Lines", CERN European Organization for Nuclear Research, Proton Synchrotron Division, Linac Group, Nov. 1959, 18 pages.

Emerson, Darrel, "The Twelfth-Wave Matching Transformer", document retrieved on Nov. 12, 2010, Available at: http://www.tuc.nrao.edu/-demerson/twelfthltwelfth.htm.

Liao, Samuel Y., "Balanced Amplifier Design and Power-Combining Techniques", Microwave Circuit Analysis and Amplifier Design, pp. 161-192, 1978.

McDonald, Kirk T., "Impedance Matching of Transmission Lines", Joseph Henry Laboratories, Princeton University, Princeton, NJ 08544, Jul. 20, 2005, pp. 1-22.

International Preliminary Report on Patentability received for PCT Patent Application No. PCT/US2008/000908, issued on Sep. 1, 2009, 6 pages.

International Search Report received for PCT Patent Application No. PCT/US2008/000908, mailed on Jun. 26, 2008, 3 pages.

Invitation to Pay Additional Fees and Partial International Search Report received for PCT Patent Application No. PCT/US2010/037910, mailed on Oct. 8, 2010, 5 pages.

Regier, Frank A., "Impedance Matching with a Series Transmission Line Section", Proceedings Letters, Jan. 11, 1971, pp. 1133-1134.

Wilkinson, Ernest J., "An N-Way Hybrid Power Divider", IEEE Transactions on Microwave Theory and Techniques, Jan. 1960, pp. 311-313.

Non-Final Office Action received for U.S. Appl. No. 12/786,199, mailed on Apr. 23, 2012, 27 pages.

Office Action received for Japanese Patent Application No. 2009-551659, mailed on Jul. 3, 2012, 12 Pages. (8 pages of English translation and 4 pages of Office Action).

International Search Report and Written Opinion received for PCT Patent Application No. PCT/US2011/037324, mailed on Aug. 22, 2011, 15 pages.

Tombak, Ali, "A Ferroelectric-Capacitor-Based Tunable Matching Network for Quad-Band Cellular Power Amplifiers", IEEE Transactions on Microwave Theory and Techniques, vol. 55, No. 2, Feb. 2007, pp. 370-375.

Emerson, Darrel, "Try a Twelfth-Wave Transformer", QST, American Radio Relay League, vol. 81, No. 6, Jun. 1997, pp. 43-44.

Office Action received for Japanese Patent Application No. 2009-551659, mailed on Oct. 11, 2011, 4 pages of English translation only.

International Preliminary Report on Patentability received for PCT Patent Application No. PCT/US2011/052740, mailed on Apr. 18, 2013, 9 pages.

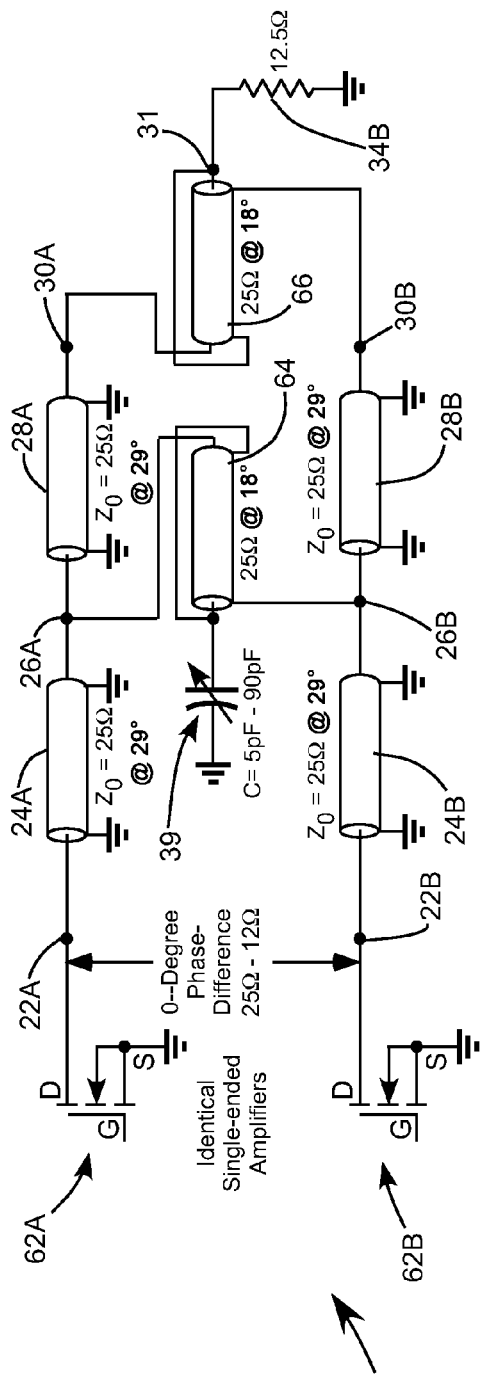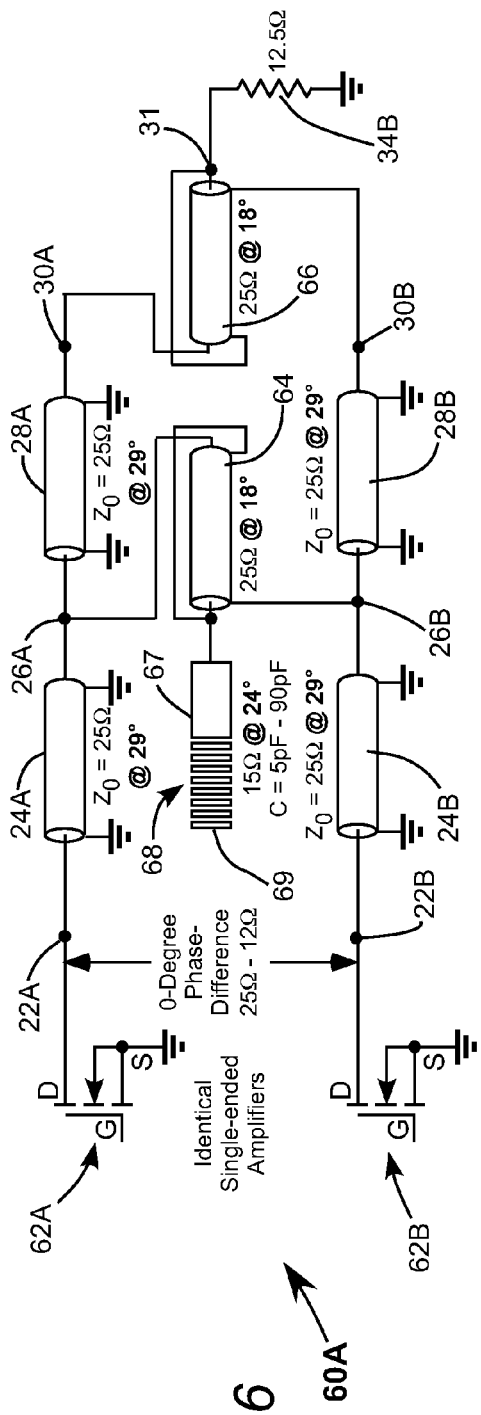

US 8,648,665 B2

IMPEDANCE-MATCHING CIRCUITS FOR MULTI-OUTPUT POWER SUPPLIES DRIVING CO₂ GAS-DISCHARGE LASERS

PRIORITY

This application claims priority to U.S. Provisional Application Ser. No. 61/390,516, filed Oct. 6, 2010, the disclosure of which is incorporated herein by reference.

TECHNICAL FIELD OF THE INVENTION

The present invention relates in general to impedance matching a radio frequency power supply (RFPS) to a load provided by discharge electrodes and related components in a radio frequency (RF) driven $CO_2$ gas-discharge laser. The invention relates in particular to impedance matching an RFPS having a plurality of outputs, or a plurality of RFPSs, to the load.

DISCUSSION OF BACKGROUND ART

It is well known the for optimum power transfer from a RFPS to a load an impedance-matching circuit is required. The output power of a $CO_2$ gas discharge laser increases directly with increasing discharge volume. The RF input (load) impedance of the laser varies inversely as the output power and decreases directly as the area of the discharge. The load impedance can vary between lasers within the same model family due to variations in discharge gas pressure, spacing between the electrodes, and other factors. Because of this, it is desirable to have an impedance-matching circuit that has a selectively variable impedance, such that a power supply having a fixed output impedance can be matched precisely to any one of a family of lasers having a load impedance anywhere within an anticipated range for that family.

U.S. patent application Ser. No. 12/786,199, by Hauer et al., assigned to the assignee of the present invention, and the complete disclosure of which is hereby incorporated by reference, describes an impedance-matching circuit comprising two series-connected lengths of transmission line, each thereof having an electrical length of about one-twelfth ($^1/_{12}$) wavelength at an operating frequency of the circuit, for matching the impedance of an RF power supply to a load. The impedance of the circuit is made selectively variable by connecting a variable impedance shunt to ground to a node between the two transmission line lengths. The variable impedance shunt can be a variable resistor, a variable capacitor, or a variable inductor. This arrangement has an advantage that a range of load impedances can be accommodated with a common transmission-line length. This reduces parts inventory in a manufacturing process for a family of lasers.

A disadvantage of the above discussed Hauer et al. arrangement is that it provides only for matching the impedance of a single-ended power supply to a load. In driving high power lasers it may be desirable to use in the power supply the output of a plurality of RF amplifiers with each being a separate output (end) of the power supply. This is because the power output of one RF amplifier can be limited by the power handling capability of amplifier components such as power transistors. There is a need for an impedance-matching circuit that is capable of connecting a multi-ended power supply to a load while still preserving advantages of the Hauer et al. arrangement.

SUMMARY OF THE INVENTION

The present invention is directed to an impedance-matching network for connecting a plurality of radio-frequency power-sources to a load. The network has an input impedance and an output impedance and the load has a load impedance.

One aspect of the inventive network comprises a plurality of radio frequency transmission-lines equal in number to the plurality of radio frequency power sources having a source impedance. Each transmission-line is connected to a corresponding one of each of the power sources with the transmission lines being connected to the load via a first radio frequency combiner. Each transmission-line includes a pair of series connected transmission line sections with each section in the pair having an electrical length of about one-twelfth of a wavelength at an operating frequency of the power-sources. The series-connection between the transmission-line sections in one pair thereof being connected to the series-connection between the first and second transmission-line sections in a pair thereof in at least one other transmission-line by a device having an impedance adjustable within a first predetermined range for matching one of the input and output impedance of the network to respectively one of the source impedance and the load impedance.

BRIEF DESCRIPTION OF THE DRAWINGS

FIG. 5 schematically illustrates still yet another embodiment of an impedance matching network in accordance with the present invention configured for impedance matching two separate RF sources having a variable output-impedance to a single load having a fixed input impedance with zero phase-difference between the outputs of the RF sources. This embodiment is similar to the embodiment of FIG. 2 with exceptions that the BalUn transformer is replaced by a coaxial zero-degree two-way combiner for combining outputs of the transmission line pairs and variable impedance between the line pairs is provided by another zero-degree two-way combiner shunted to ground by the variable capacitance.

FIG. 6 schematically illustrates an additional embodiment of an impedance matching network in accordance with the present invention configured for impedance matching two separate RF sources having a variable output-impedance to a single load having a fixed input impedance, the embodiment being similar to the embodiment of FIG. 5 with an exception that the variable capacitance is provided by a transmission line stub having an incrementally variable length.

DETAILED DESCRIPTION OF THE INVENTION

Figure 1:
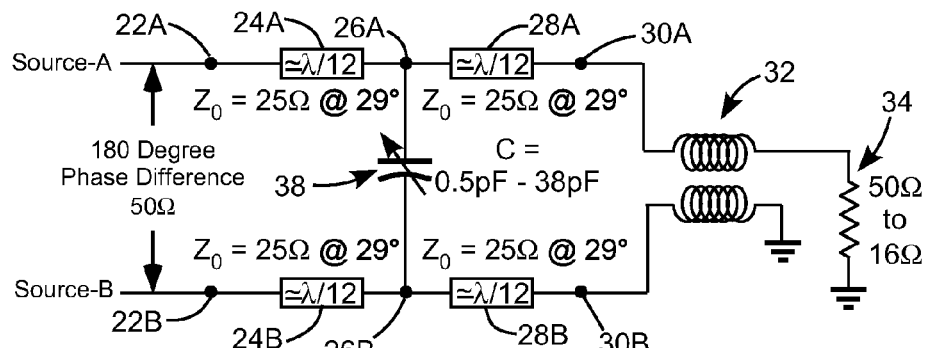
FIG. 1 schematically illustrates one preferred embodiment of impedance matching network circuitry in accordance with the present invention used for matching the output impedance of two RF-power sources having a fixed load impedance and a 180-degree phase-difference therebetween to a load which can have a load impedance varying within a predetermined range, the network including two identical pairs of series-connected twelfth-wave transmission-lines sections one connected to each of the source with the output of the pairs combined and connected to the load via a balanced-to-unbalanced (BalUn) transformer and variable impedance matching provided by a variable capacitance shunt between junction points of transmission line sections in the pairs thereof.

Referring now to the drawings, wherein like features are designated by like reference numerals, FIG. 1 schematically illustrates one preferred embodiment of impedance matching network circuitry in accordance with the present invention, arranged to match the output of two RF sources (Source-A and Source-B) having a fixed output-impedance across nodes 22A and 22B, but with a 180-degree phase-difference therebetween to a single load 34 having a load-impedance $Z_L$ which may vary, according to type, in an anticipated range. Here, fixed impedance across nodes 22A and 22B is 50 Ohms ($\Omega$) and the anticipated load impedance range $Z_L$ range is between 50$\Omega$ and 16$\Omega$.

Node 22A from Source-A is connected to length of transmission line section 24A having a characteristic impedance $Z_0$ of 25$\Omega$ and an electrical length of slightly less than one-twelfth wave at the design RF frequency, here assumed to be 100 MHz. In the drawing of FIG. 1, and other drawings describing other embodiments of the present invention, electrical lengths of transmission lines are designated in degrees (360° being equal to one-wavelength) or fractional wavelengths (with $\lambda$ being equal to one wavelength), whichever is deemed more convenient. In this example, transmission line section 24A has a length of 29° ($\lambda/12=30°$).

Transmission line section 24A is connected to another transmission line section 28A of the same characteristic impedance and electrical length via a node 26A therebetween. Node 22B from Source-B is connected to transmission line sections 24B and 28B in series via node 26B therebetween. Transmission line sections 24B and 28B have the same characteristics as sections 24A and 28A. This arrangement is known to practitioners of the art as a 180-degree symmetrical network. Nodes 30A and 30 B at the output of transmission line sections 28A and 28B, respectively, are connected via a balanced-to-unbalanced (BalUn) transformer 32 to load 34.

Each connection line to the transformer, or an equivalent combiner, from the corresponding source can be defined as a "load-line", that is to say, a load-transmission line. In any such load-line, there will be, at a minimum, the first and second twelfth-wave transmission line sections, universally designated herein by reference numerals 24 and 28, with appropriate subscripts A, B or C, depending on the number of sources and corresponding load-lines.

Figure 2:
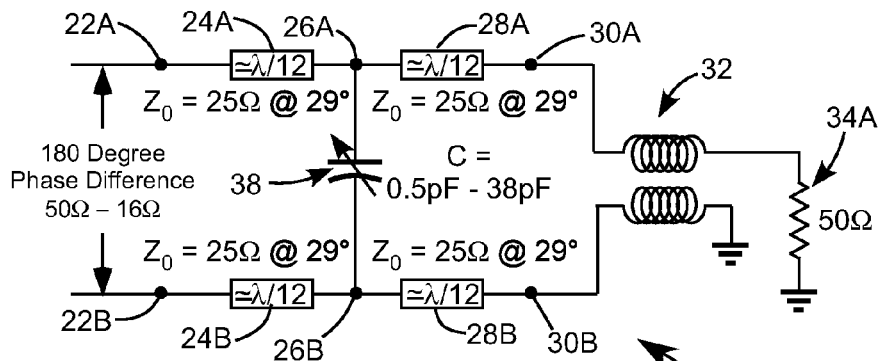
FIG. 2 schematically illustrates another preferred embodiment of impedance matching network circuitry in accordance with the present invention similar to the embodiment of FIG. 1 but wherein the load impedance is fixed and the output impedance of the sources can vary within a predetermined range.

Matching to the variable load impedance of load 34 is accomplished in circuit 20 by connecting a selectively variable, i.e., adjustable, impedance between nodes 26A and 26B. In this example, the adjustable impedance is a selectively variable capacitance 38 having a capacitance C which can be varied between 0.5 picofarads (pF) and 38.0 pF, for an impedance match between 50$\Omega$ and 16$\Omega$, respectively, of load 34. The values for capacitor 34, and for other circuit components in other embodiments of the inventive circuitry described hereinbelow, were calculated using circuit-simulation software PSpice™ available from Cadence Design Systems Inc., of San Jose, Calif. The circuitry of FIG. 1 can be used to match sources having an output impedance which varies, according to type, to a particular load which has a fixed impedance. This is illustrated in FIG. 2 as an another preferred embodiment 20A of the present invention, wherein the variable-capacitance-shunted transmission symmetrical network of arrangement 20 is used to match a load 34A having a load impedance of 50$\Omega$ to a pair of sources which may provide an impedance across nodes 22A and 22B of between 50$\Omega$ and 16$\Omega$. This variation is accommodated, as discussed above, by adjusting the capacitance of variable-capacitance 38 between 0.5 pF and 38.0 pF.

Figure 3:
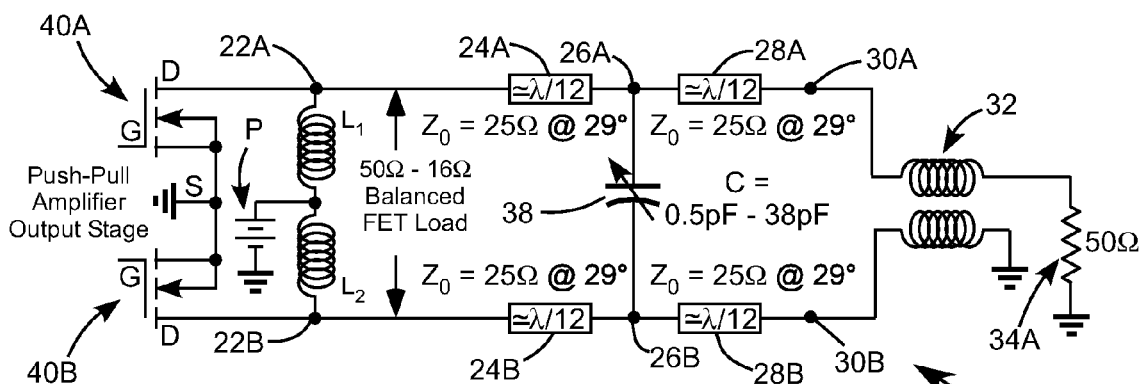
FIG. 3 schematically illustrates yet another preferred embodiment of impedance matching network circuitry in accordance with the present invention similar to the embodiment of FIG. 2 but wherein the two separate sources are replaced by a final amplifier stage comprising two FETs in a push pull arrangement with each of the pairs of transmission line sections connected to a corresponding one of the FETs.

FIG. 3 schematically illustrates yet another preferred embodiment of impedance matching network circuitry in accordance with the present invention similar to the embodiment of FIG. 2 but wherein the two separate RF sources are replaced by a final amplifier stage comprising two field effect transistor (FETs) 40A and 40B in a push-pull arrangement.

Here the drain (D) of FET 40A is connected to node 22A and the drain of FET 40B is connected to node 22B. DC power for powering the amplifier stage is coupled to the two FETs from a source P, via RF chokes $L_1$ and $L_2$. The signal being amplified is applied to gates G of the FETs and the sources of the FETs are commonly grounded. Impedance matching is accomplished as described above via selectively variable capacitance 38 for adjusting the output power and efficiency of the final amplifier stage.

Figure 4:
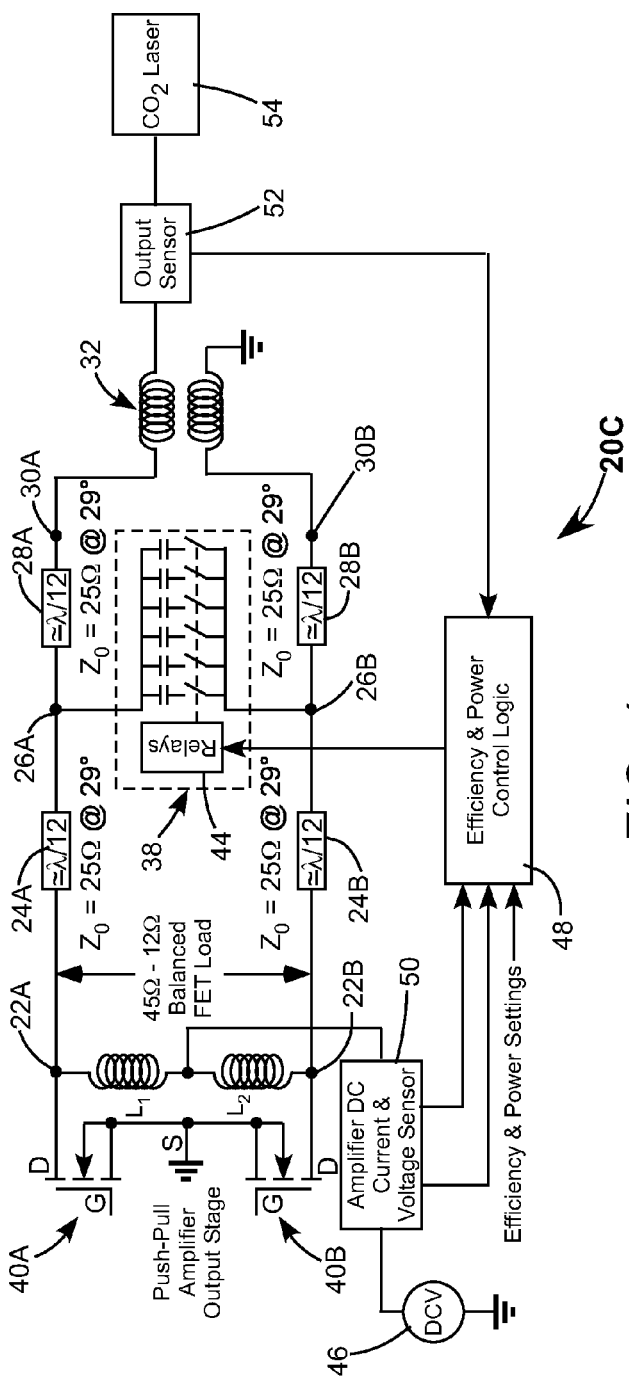
FIG. 4 schematically illustrates still another preferred embodiment of impedance matching network circuitry in accordance with the present invention similar to the embodiment of FIG. 3 but wherein the variable capacitance is provided by a bank of six capacitors automatically switchable alone or in any parallel combination thereof in response to monitored values of power-output and efficiency of the circuit.
Figure 4A:
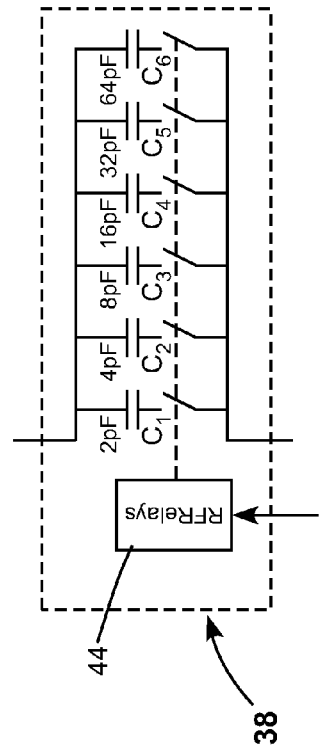
FIG. 4A schematically illustrates the variable capacitor from FIG. 4 in more detail.

FIG. 4 and FIG. 4A schematically illustrate still another embodiment 20C of the present invention similar to the embodiment of FIG. 3 but wherein the impedance matching and corresponding efficiency optimization are automated. In order to facilitate this automation, variable capacitance 38 is implemented in embodiment 20C as a plurality of individual capacitances $C_1$, $C_2$, $C_3$, $C_4$, $C_5$ and $C_6$ that can be connected between nodes 26A and 26B, alone or in various parallel combinations. Connection is effected by RF relays 44 (collectively depicted) operating corresponding switches as illustrated (see FIG. 4A for detail). Such relays are commercially available incorporated in a multi-pole relay model S172 from Teledyne Relays Inc., of Hawthorne, Calif.

In circuit 20C, capacitors $C_1$-$C_6$ have values 2 pF, 4 pF, 8 pF, 16 pF, 32 pF and 64 pF respectively. This enables total capacitance to be varied from 2 pF to 126 pF in increments of 2 pF for matching a balanced FET load varying from 45Ω to 12Ω, respectively. Relay-coil connections, DC blocking capacitor connections and other well-known details of the switching arrangement are not shown for simplicity of illustration. Relays 44 may be by replaced by other suitable switching technology such PIN-diode switching devices.

DC voltage is supplied to the FETs from a DC voltage (DCV) source 46 through RF chokes $L_1$ and $L_2$ as described above with reference to FIG. 3. A power control logic module 48 monitors the DC voltage and current via a voltage and current sensor 50, and monitors output power of the network via a power monitor 52. A user inputs required power and efficiency value settings to the control module as illustrated in FIG. 4. The control module calculates required capacitance for achieving the set values and instructs relays 44 to switch accordingly to provide the necessary combination of capacitors $C_1$-$C_6$. Power output of the network is delivered to a $CO_2$ laser 54 having a load impedance of 50Ω.

FIG. 5 schematically illustrates still yet another embodiment 60 of an impedance matching network in accordance with the present invention. Network 60 is configured for impedance matching two separate RF sources having a variable output impedance, to a single load having a fixed input impedance. In this embodiment the sources are represented by final FET amplifier stages 62A and 62B. Here there is zero phase-difference between the outputs of the FETs with an output impedance of each one which can vary between 25Ω and 12Ω.

The network includes twelfth-wave transmission line section pairs 24A and 28A, and 24B and 24B as in above-described embodiments. In FIG. 5, these, and other transmission line sections are represented as lengths of 25Ω coaxial cable. As they are functionally equivalent to above-described transmission line sections, and have the same electrical characteristics, the original reference numerals are retained to assist comparison of embodiments.

Because there is zero phase difference between inputs to the transmission line sections, it is not possible to connect a variable tuning capacitance directly between nodes 26A and 26B between the transmission line sections. In this embodiment, a length of transmission line 64 is connected as a zero-degree two-way combiner which combines the in-phase currents at nodes 26A and 26B. Transmission line 64 has a characteristic impedance of 25Ω and an electrical length of about λ/20, i.e., 18°. Transmission line section 64 delivers an RF signal to one end of a selectively variable capacitor 39, the other end of which is connected to ground.

The capacitance of capacitor 39 can be varied to adjust the individual output impedances of the FETs in the range between 25Ω and 12Ω. Doing so adjusts saturated peak-to-peak voltage in the inventive variable impedance network thereby adjusting the output power and efficiency of the amplifier stage. Varying the capacitance between 5 pF to about 90 pF adjusts output impedances in the 25Ω to 12Ω range. A transmission line section 66 having the same characteristics as transmission line section 64 replaces the Balun transformer of above-described embodiments. This transmission line section is also connected as a zero-degree two-way combiner and combines the currents from nodes 30A and 30B to be in phase at node 31 which is connected to a fixed load 34B having an impedance of 12.5Ω.

FIG. 6 schematically illustrates still an additional embodiment 60A of an impedance matching network in accordance with the present invention. Embodiment 60A is similar to above-described embodiment 60 with an exception that variable capacitance 39 of embodiment 60 is replaced in embodiment 60A by a transmission-line stub 68 including a minimum-length section 67 and a variable section 69 which can be incrementally varied in length by adding by adding or subtracting one or more of a plurality of incremental sections 69 (only one designated in FIG. 6) using a wire bridging connection (not shown). Independent of how many sections are connected (or not connected), the characteristic impedance, here 15Ω, and total electrical length, here 24°, will stay the same. The capacitance, however, will vary accordingly, to the amount of incremental sections connected, in this example, in incremental values between 5 pF and 90 pF.

Figure 7:
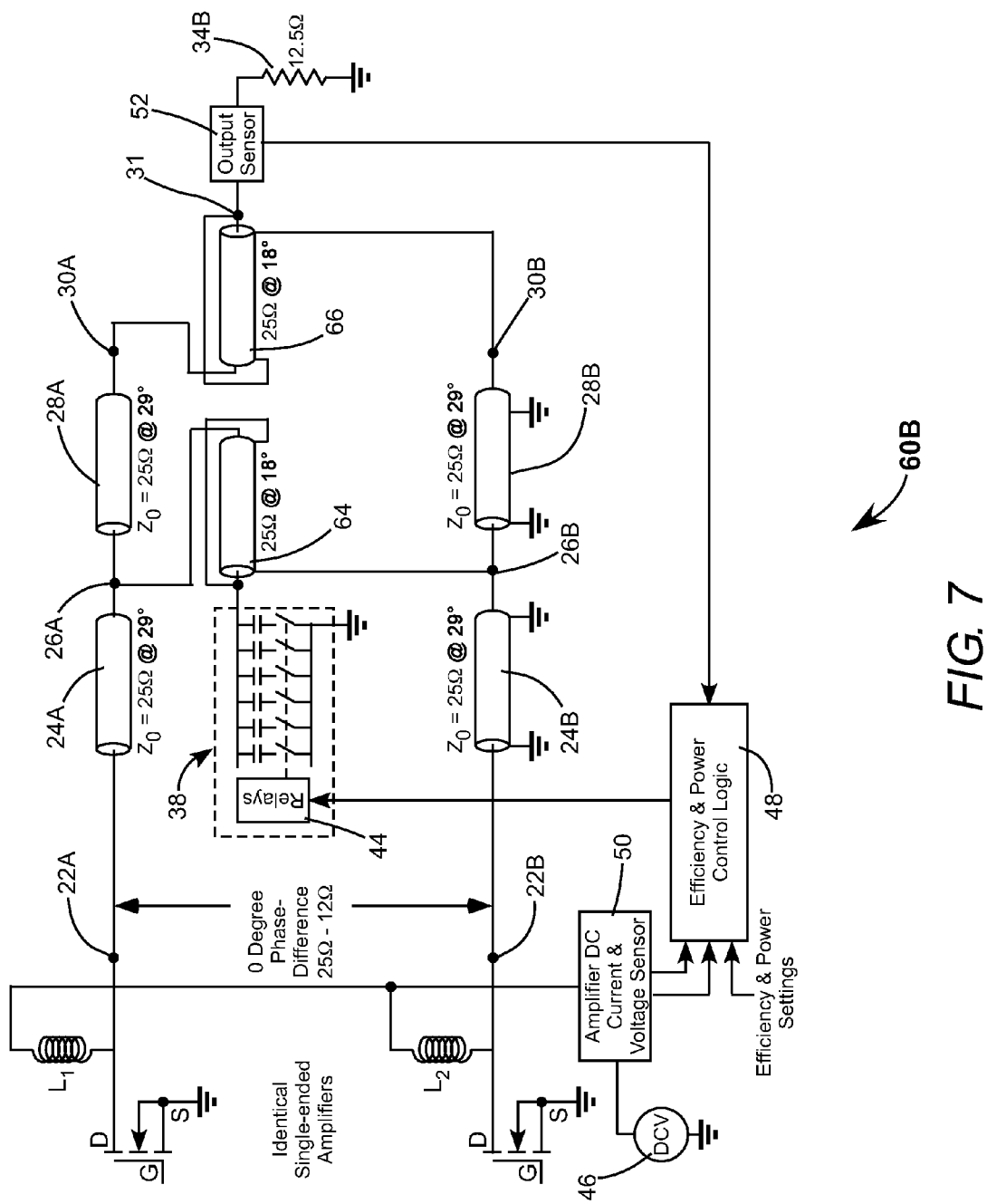
FIG. 7 schematically illustrates another additional embodiment of an impedance matching network in accordance with the present invention configured for impedance matching two separate RF sources having a variable output-impedance to a single load having a fixed input impedance, similar to the embodiment of FIG. 5 but wherein the variable capacitance is provided by a bank of capacitors automatically switchable alone or in any parallel combination thereof in response to monitored values of power-output and efficiency of the circuit.

FIG. 7 schematically illustrates another additional embodiment 60B of an impedance matching network in accordance with the present invention. This is essentially embodiment 60 controlled by a logic controller and sensors as described above with referenced to FIG. 4. In embodiment 60B variable capacitance 39 is replaced by a relay-switched capacitor bank 38 similar to that described above with reference to FIGS. 4 and 4A.

Figure 8:
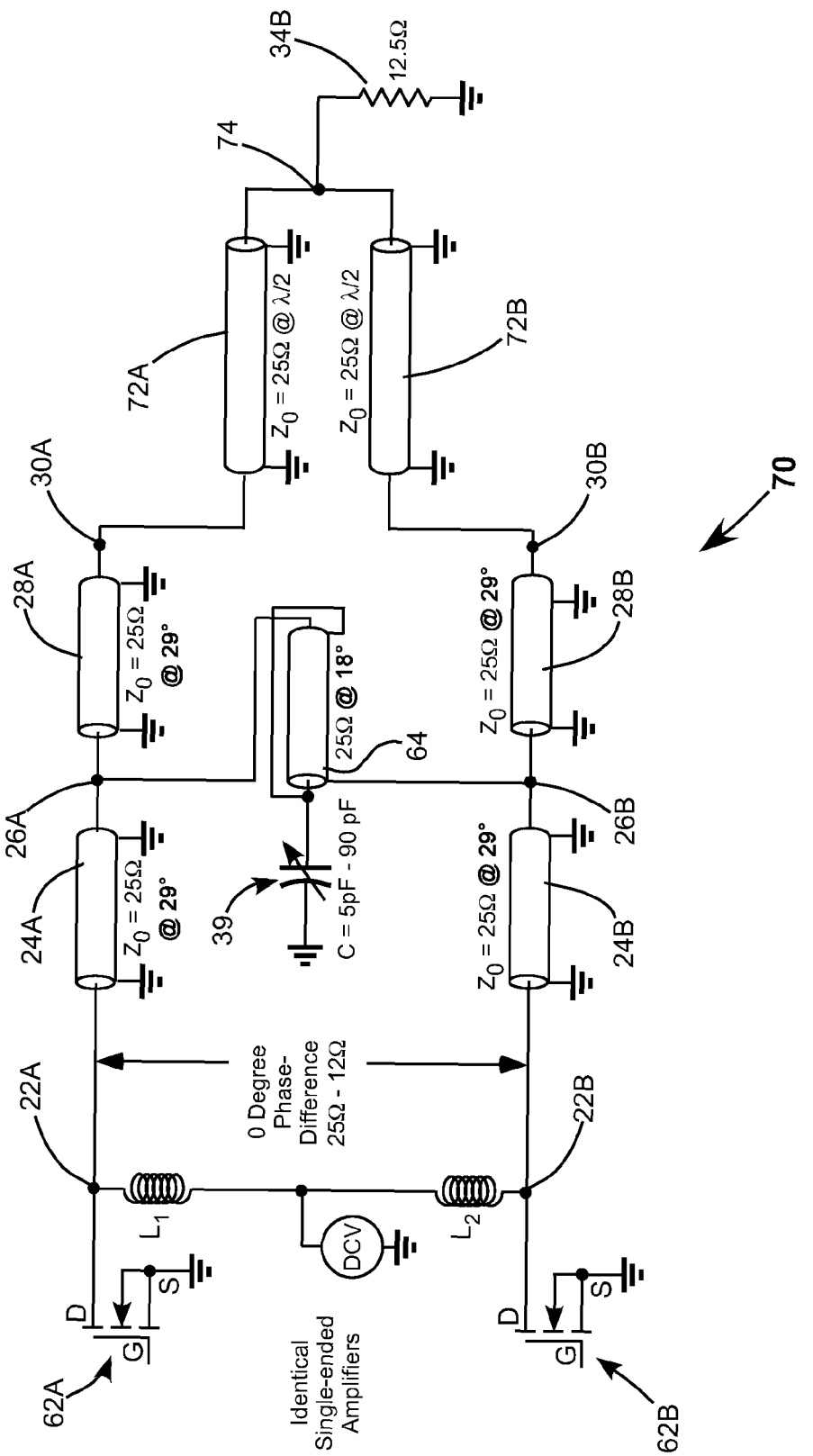
FIG. 8 schematically illustrates yet another additional embodiment of an impedance matching network in accordance with the present invention for impedance matching two separate RF sources having a variable output impedance and zero phase-difference between the outputs, to a single load having a fixed input impedance.

FIG. 8 schematically illustrates yet another additional embodiment 70 of an impedance matching network in accordance with the present invention for impedance matching two separate RF sources having a variable output impedance and zero phase-difference between the outputs, to a single load having a fixed input impedance. The RF sources are represented by final-amplifier-stage FETs 62A and 62B. This embodiment is similar to embodiment 60 of FIG. 5 with an exception that zero-degree two-way combiner 66 of embodiment 60 is replaced in embodiment 70 by a parallel λ/2 transmission line sections 72A and 72B the outputs of which are combined at a common node 74 connected to fixed load 34B.

Figure 9:
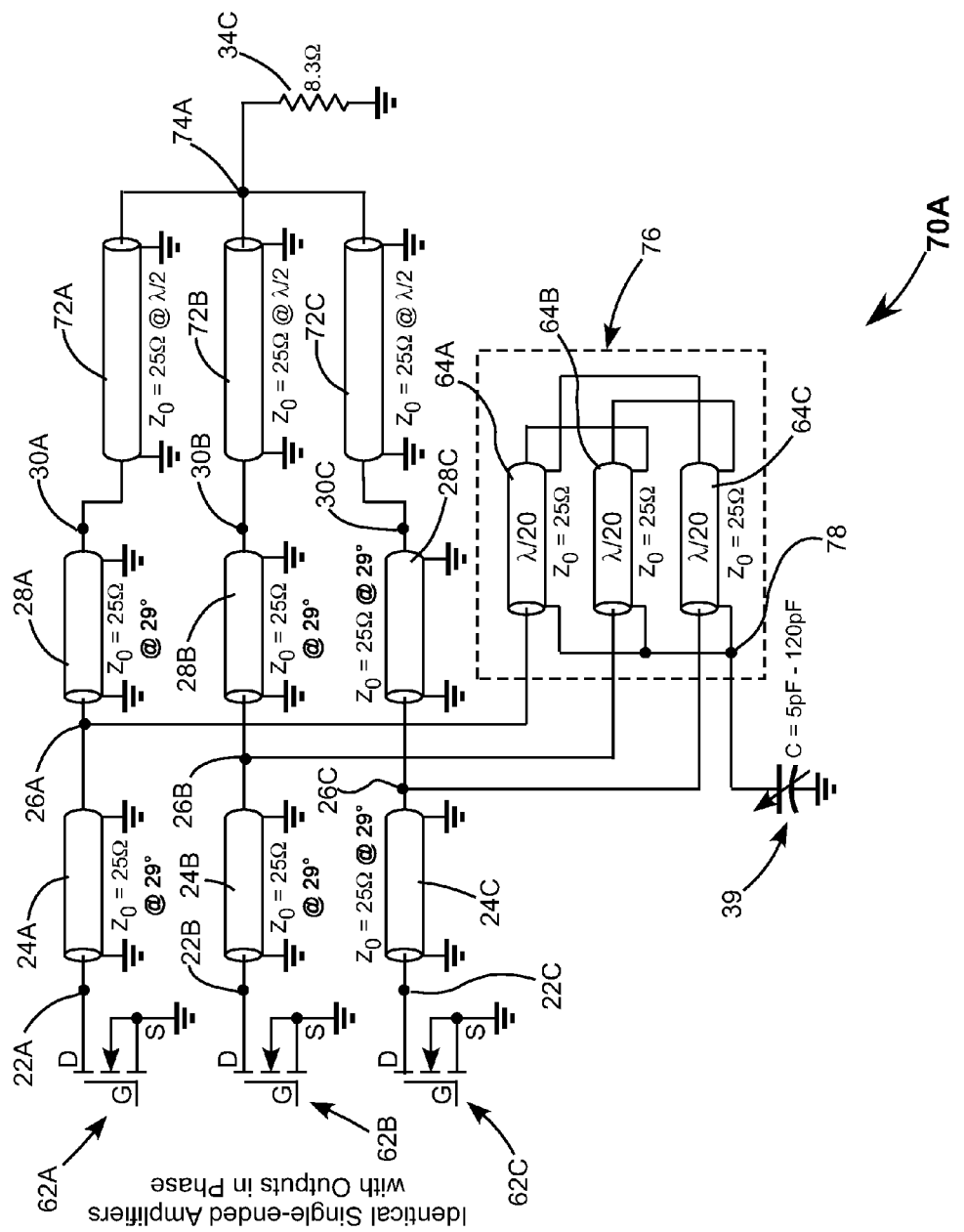
FIG. 9 schematically illustrates still yet another additional embodiment of an impedance matching network in accordance with the present invention for impedance matching three separate RF sources having a variable output impedance and zero phase-difference between the outputs, to a single load having a fixed input impedance.

FIG. 9 schematically illustrates still yet another additional embodiment 70A, of an impedance matching network in accordance with the present invention, here, for impedance matching three separate RF sources, 62A, 62B, and 62C having a variable output impedance and zero phase-difference between the outputs, to a single load having a fixed input impedance. This embodiment is similar to above described embodiment 70 of FIG. 8 with an exception that, in order to accommodate the third source 62C, another load line including two approximately twelfth-wave sections 24C and 24C is added with corresponding nodes 22C, 26C, and 30C.

Instead of the single λ/20 length of transmission line 64 used as a current combiner in embodiment 70 a zero-degree three-way combiner 76 is formed from three similar lengths of transmission line 64A, 64B, and 64C connected as an equal-delay combiner. Currents from nodes 26A-C are combined by combiner 76 at a common node 78 and shunted to ground through selectively variable capacitance 39 to ground as discussed above to effect adjustable impedance-matching. In theory at least, four or more sources may be combined as depicted in FIG. 9.

TABLE 1

| Capacitor 39 (pF) | Total Input Power At all nodes 22 | Input Impedance at each node 22 | Output Power Total at node 74A |
|---|---|---|---|
| 1 pF | 5784 Watts | 24.8 Ohms | 5688 Watts |
| 20 pF | 5802 Watts | 22.7 Ohms | 5697 Watts |
| 30 pF | 5796 Watts | 21.5 Ohms | 5685 Watts |
| 50 pF | 5751 Watts | 19.2 Ohms | 5619 Watts |
| 60 pF | 5703 Watts | 18.1 Ohms | 5565 Watts |
| 70 pF | 5640 Watts | 16.9 Ohms | 5493 Watts |
| 80 pF | 5556 Watts | 15.9 Ohms | 5406 Watts |
| 90 pF | 5454 Watts | 14.8 Ohms | 5301 Watts |
| 100 pF | 5328 Watts | 13.8 Ohms | 5181 Watts |
| 120 pF | 5028 Watts | 11.8 Ohms | 4890 Watts |

Table 1 depicts calculated values of total input power and total output power in the circuit of FIG. 9 for various values of capacitor 39. The decrease in input and output power is due to increasing circuit losses as the input impedance of the circuit was decreased by increasing the value of capacitor 39.

Figure 10:
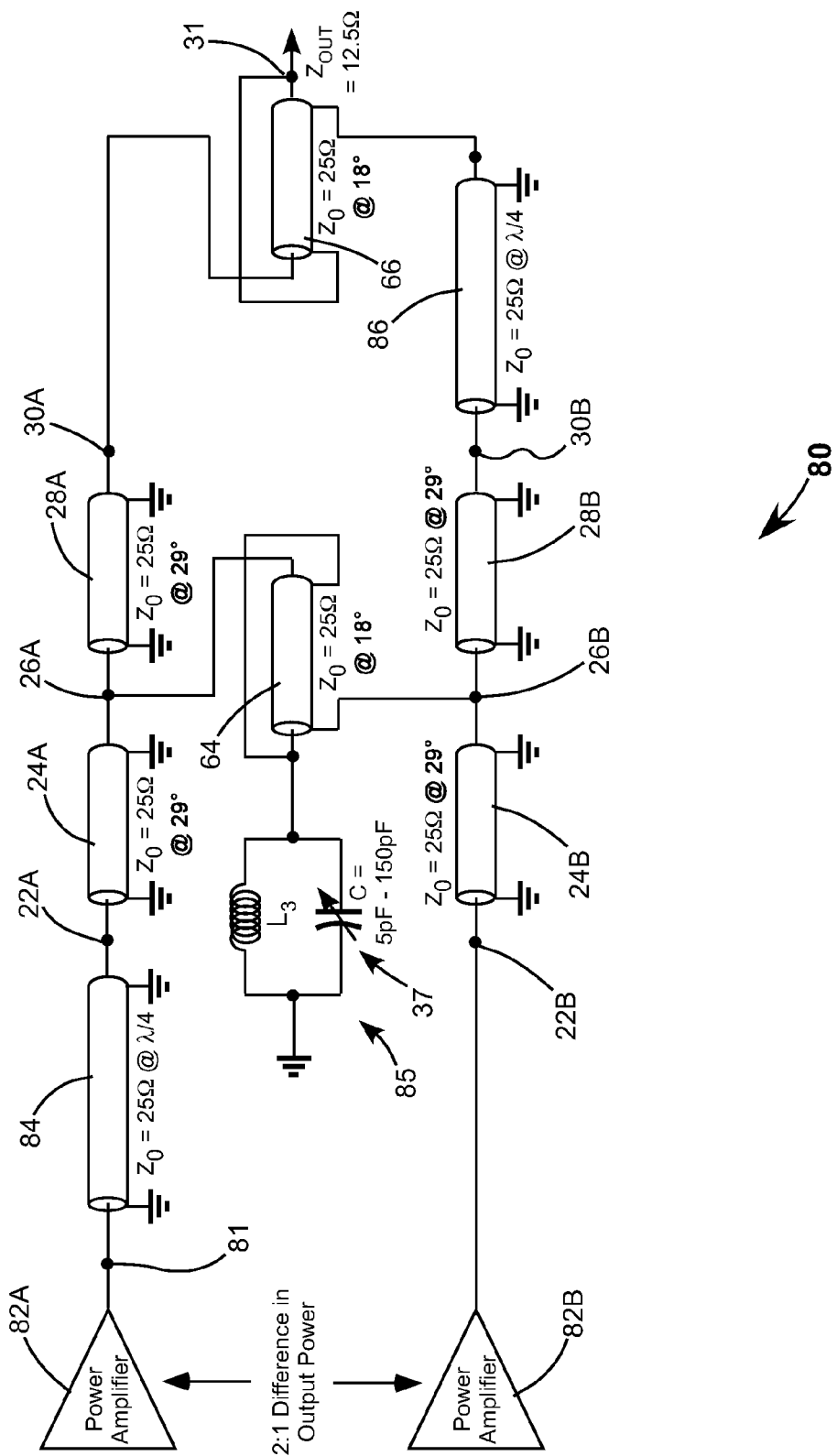
FIG. 10 schematically illustrates a further embodiment 80, of an impedance matching network in accordance with the present invention for impedance matching two power amplifiers having different output powers with the outputs in phase.

In all of the above described embodiments the radio frequency sources in any one all have about the same output power. FIG. 10 schematically illustrates a further embodiment 80, of an impedance matching network in accordance with the present invention, here for impedance matching two power amplifiers 82A and 82B having different output powers with the outputs in phase. In the example of FIG. 10 it is assumed that the output power ratio is 2:1. Each amplifier has a nominal output impedance of 25Ω. Embodiment 80 is similar to embodiment of FIG. 5 inasmuch as it includes the network of two pairs of twelfth-wave transmission line sections 24A and 28A, and 24B and 28B with currents at nodes 26A and 26B thereof combined by zero-degree two-way combiner 64 shunted to ground at one end thereof by a selectively variable impedance (reactance) 85.

In embodiment 80 however a λ/4 (90° length of 25Ω transmission line 84 is inserted between amplifier 82A and transmission line section 24A to drive the (A) side of the network in quadrature with the opposite (B) side. A complementary length of 25Ω transmission line 86 is inserted between transmission line section 28B and zero-degree two-way combiner 66 for offsetting the phase-shift introduced by transmission line section 84.

In variable reactance 85, a fixed inductance $L_3$ is connected in parallel with variable capacitance 37 in the shunt to ground. By operating in quadrature, the tuning reactance, 85, is allowed to continuously change from inductive to capacitance. This is to offset the tuning of capacitor 37 and allow the input impedances of the A and B sides of the network to be tuned through a midpoint where the impedances are equal. This means that it does not matter which amplifier has the higher output power. For an adjustment range of capacitor 37 between 5 pF and 150 pF, the inductance value of $L_3$ is preferably 48 nanohenries (nH).

The circuit arrangement of embodiment 80 allows the combining of the outputs of amplifiers of different output powers without loss of combining efficiency. By way of example, an amplifier of 1000 W output may be combined in phase with another amplifier of 600 W output to achieve (minus circuit losses) 1600 W of total output. Calculations performed for the values shown in FIG. 10 indicate that one input can be 1000 W and the other input can varied from 390 W, when C=17 pF, to 1590 W when C=72 pF. Total combined power at node 31 is 1315 W to 2472 W for the range of values indicated for capacitor 37. Calculations indicate that small changes in input impedance of the A and B sides of the network due to the tuning of the capacitor 30 remain within a voltage standing wave ratio (VSWR) of 1.15:1 relative to the nominal 25Ω design center. Small variations in the actual input power at node 22A are due to such changes in the input impedance.

TABLE 2

| Capacitance 37 | Zin at Node 81 | Zin at Node 22B | Power at Node 81 | Power at Node 22B | Output at Node 31 |
|---|---|---|---|---|---|
| 17 pF | 26.9 Ohms | 27.1 Ohms | 922 W | 390 W | 1315 W |
| 27 pF | 26.5 Ohms | 26.5 Ohms | 934 W | 567 W | 1511 W |
| 47 pF | 25.6 Ohms | 25.6 Ohms | 969 W | 969 W | 1894 W |
| 60 pf | 24.8 Ohms | 24.9 Ohms | 983 W | 1279 W | 2184 W |
| 72 pF | 24.1 Ohms | 25.0 Ohms | 982 W | 1590 W | 2472 W |

TABLE 2 provides a summary of the above discussed analysis of the variation in impedance at nodes 81 and 22B of FIG. 10 for various values of capacitor 37. It can be seen that that the impedances at nodes 81 and 22B are approximately the same while the total power at node 31 is about equal to the sum of the power at nodes 81 and 22B for all practical purposes. Impedances are close to the design nominal 25Ω as discussed above.

In all of the above-discussed embodiments of the present invention an object is to drive a single laser using the combined power outputs of two or more sources. It is sometimes required, however to combine output of two lasers when one is insufficient to provide required laser power. Alternatively it may be required to drive a single laser having cascaded sets of electrodes.

Cascaded electrodes may be used, for example to increase the impedance of the load to make impedance matching easier. This reduces the amount of power that an RF power supply needs to provide, thereby reducing the circulating currents within the impedance matching network. Reducing the circulating currents reduces the size of the components within the impedance matching network and makes the discharge easier to light. Another reason for using cascaded electrodes is that in order to increase laser power it is necessary to increase the length of the electrodes thereby making the gas-discharge region longer. Eventually electrode lengths are reached which make it very difficult to keep the electrodes sufficiently parallel to one another to prevent distorting the wave-guiding of the laser beam provided by the electrode surfaces.

The distortion occurs because the electrode surfaces facing the discharge become hotter than the opposite surfaces not facing the discharge. This causes a thermal gradient across the thickness of the electrodes which in turn causes bending moments. Such bending causes the spacing between the electrodes to be larger in the center than at the ends, particularly if the ends of the electrodes are held in a fixed position.

Figure 11:
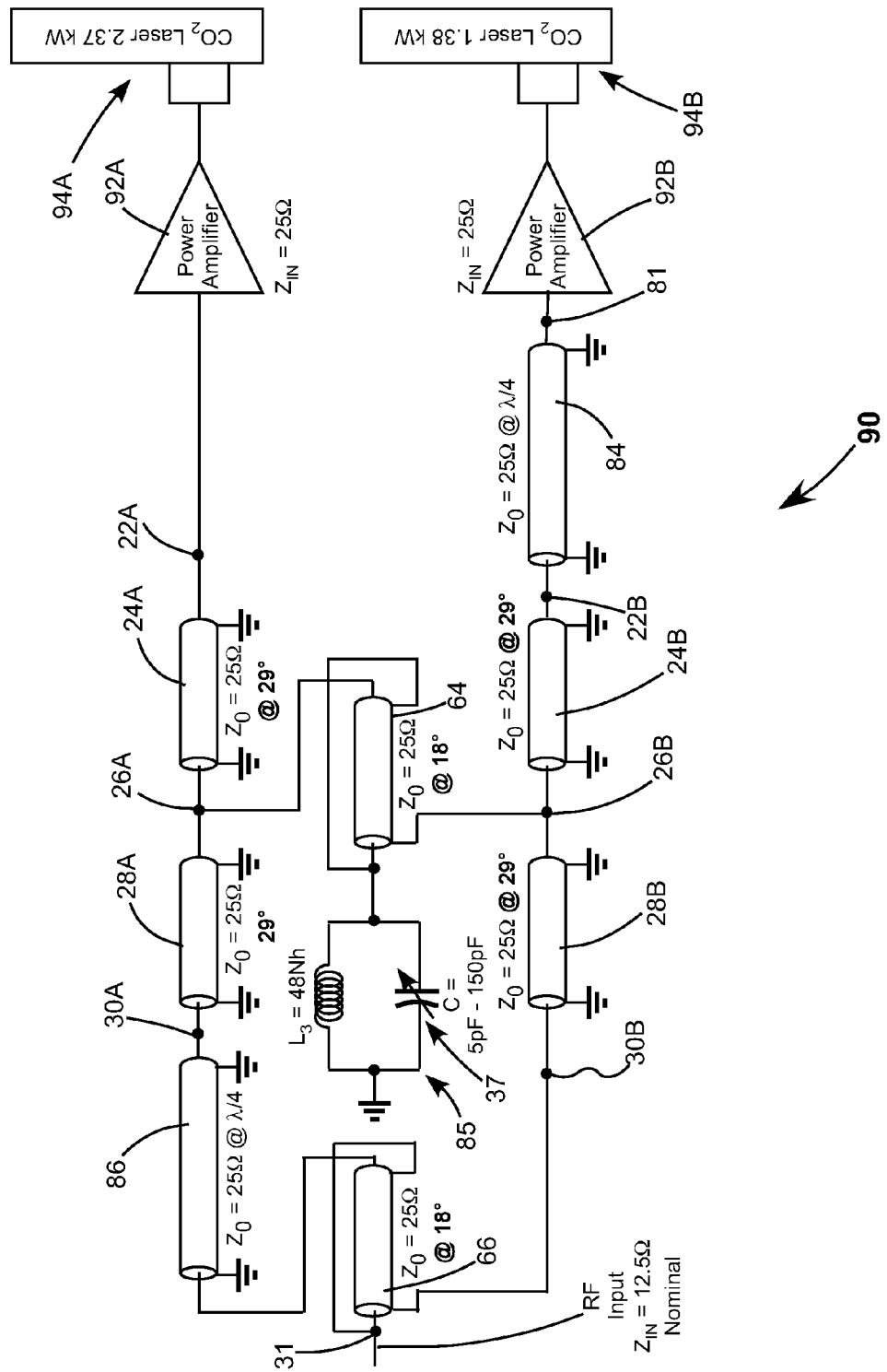
FIG. 11 schematically illustrates one preferred embodiment of an impedance matching network in accordance with the present invention for powering two power amplifiers from a single RF input, with each power amplifier driving a corresponding one of two $CO_2$ lasers and with the output powers tunable by adjusting the value of a capacitor in an LC circuit.

FIG. 11 schematically illustrates one preferred embodiment 90 of an impedance matching network in accordance with the present invention configured for powering two power amplifiers 92A and 92B from a single RF input. Amplifiers 92A and 92B drive corresponding $CO_2$ lasers 94A and 94B. In this example laser 94A is driven at a power of 2.37 kilowatts (kW) and laser 94B is driven at a power of 1.38 kW. The input impedance ($Z_{IN}$) at node 31 is 12.5Ω. Amplifiers 92A and 92B each have $Z_{IN}$ equal to 25Ω.

The impedance matching network of FIG. 11 is essentially the network of FIG. 10 used in reverse. Accordingly, reference numerals for components of embodiment 80 have been retained for corresponding components of embodiment 90. In embodiment 90, zero-degree two-way combiner 66 of FIG. 10 is used as a two-way splitter and divides an RF input signal along the A and B arms of the network. The amount of power in each of the network arms is varied by adjusting capacitor 37 of LC circuit 85 as in embodiment 80. Quarter-wave transmission line section 86 is inserted ahead of node 22A to drive the A side of the twelfth-wave section network in quadrature with the B-side thereof. Quarter-wave transmission line section 86 is inserted after node 30B to compensate for the 90° phase-shift caused by section 66. Calculations indicate that the input impedance at the amplifiers remains within 1.25:1 VSWR relative to the nominal 25Ω design center for a symmetrical output power variation of ±500 W from a nominal 1870 W null condition.

Figure 11A:
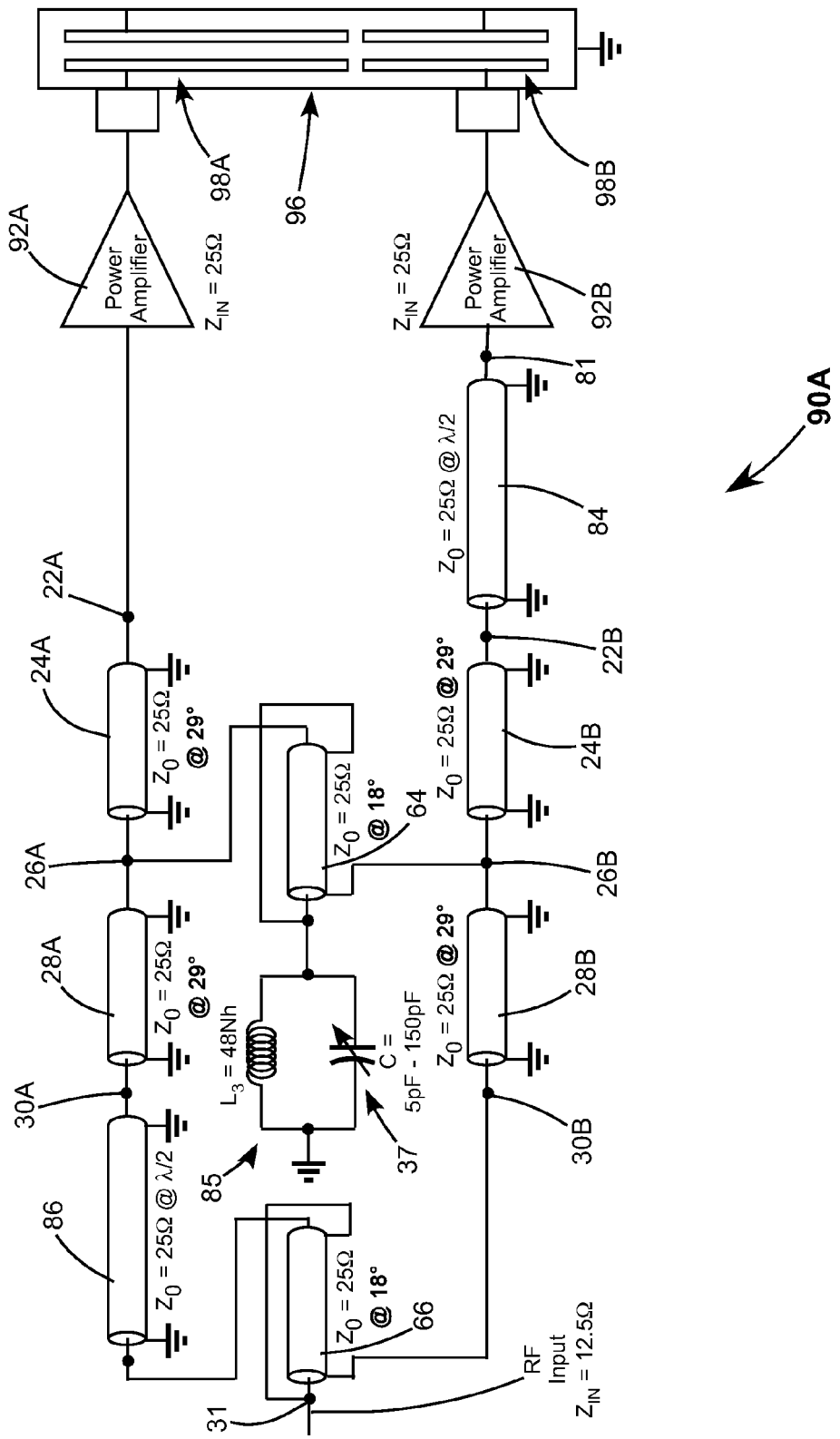
FIG. 11A schematically illustrates another preferred embodiment of an impedance matching network in accordance with the present invention for powering two power amplifiers from a single RF input, similar to the embodiment of FIG. 11 but with each power amplifier driving a corresponding one of two pairs of discharge electrodes in a single $CO_2$ laser.

FIG. 11A schematically illustrates another embodiment 90A of an impedance matching network in accordance with the present invention for driving two RF amplifiers from one input. Embodiment 90A is similar to embodiment 90 of FIG. 11 with an exception that amplifiers 92A and 92B drive respectively electrode pairs 98A and 98B of a single $CO_2$ laser 96.

Figure 12:
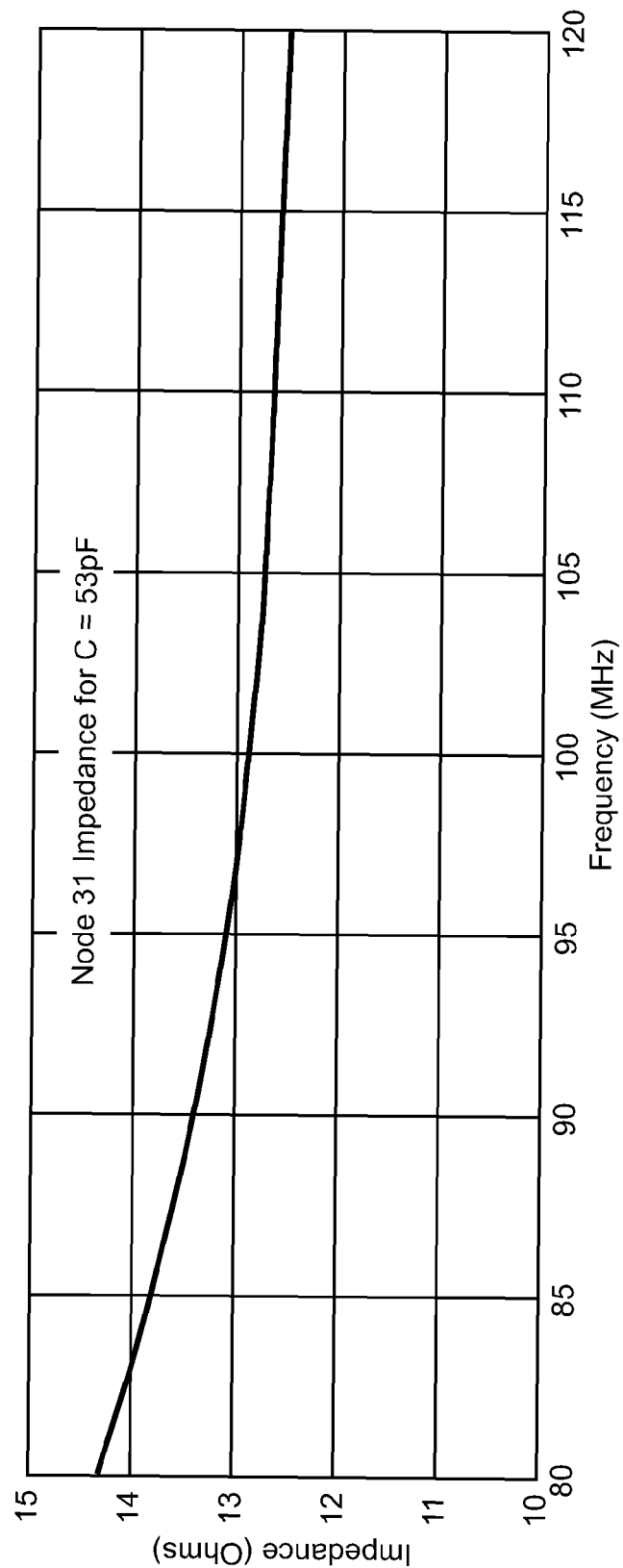
FIG. 12 is a graph schematically illustrating the impedance at the input of the network FIG. 11 as a function the frequency of the RF input for a particular value of the tuning capacitor.

FIG. 12 is a graph schematically illustrating the impedance at node 31 as a function the frequency of the RF input for a value of capacitor 37 of 53.0 pF. It can be seen that at a design frequency of 100 MHz the impedance is close to the nominal 12.5Ω design value.

Figure 13:
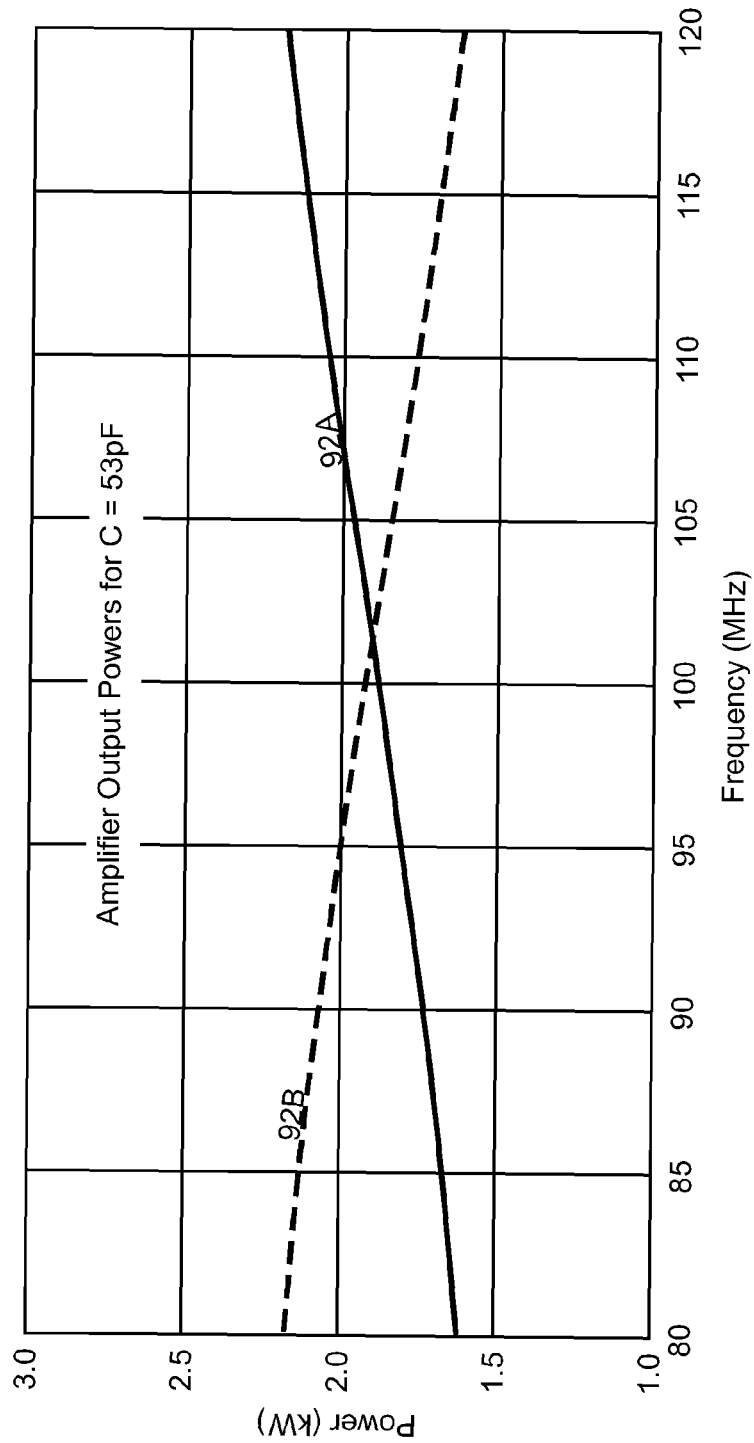
FIG. 13 is a graph schematically illustrating the outputs of amplifiers of FIG. 11 as a function of frequency of the RF input for the particular value of the capacitor.

FIG. 13 is a graph schematically illustrating the outputs of amplifiers 92A (solid curve) and 92B (dashed curve) as a function of frequency of the RF input for a value of capacitor 37 of 53.0 pF. It can be seen that at the design frequency of 100 MHz the output powers are about equal at about 1900 W close to the nominal 1870 W value.

TABLE 3

| Capacitance 37 | $Z_{IN}$ at Node 31 | Output of Amp 92A | Output of Amp 92B |
| --- | --- | --- | --- |
| 1 pF | 14.3 Ohms | 1284 W | 2460 W |
| 53 pF | 12.9 Ohms | 1900 W | 1900 W |
| 100 pF | 12.5 Ohms | 2570 W | 1260 W |

TABLE 3 lists variations in calculated impedances at node 31 of FIG. 11 for selected values of the capacitance of capacitor 37 together with corresponding calculated power output of amplifiers 92A and 92B. These calculations were made at a nominal design frequency of 100 MHz.

Figure 14:
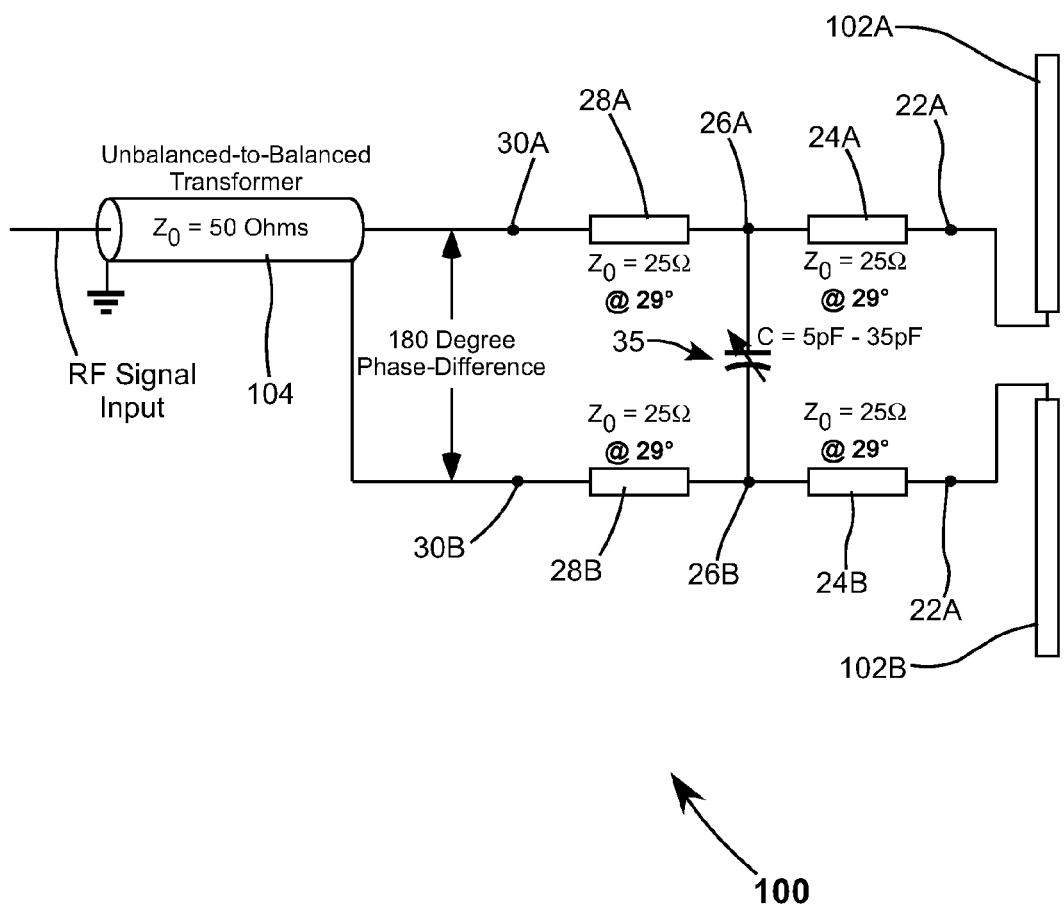
FIG. 14 schematically illustrates a preferred embodiment of an impedance matching network in accordance with the present invention for powering a dipole antenna.

FIG. 14 schematically illustrates a preferred embodiment 100 of an adjustable impedance matching network in accordance with the present invention arranged for driving a dipole antenna. In principle, this embodiment is similar in operation to above-described embodiment 90 inasmuch as an RF signal is split into two parts and delivered via a basic network of two pairs of twelfth-wave transmission line sections to two dipole elements 102A and 102B. The two pairs of transmission line sections comprise sections 24A and 28A in one load line (the A side of the network) and sections 24B and 28B in the other load line (the B side of the network). Node 26 A between sections 24A and 24B is connected to node 26B a selectively variable capacitance 3, here tunable from 5 pF to 35 pF.

The input RF signal is split into two parts by an unbalanced-to-balanced transformer 104 formed by a length of transmission line having a fixed (source) impedance of 50Ω, in this example. The outputs of transformer 104 are delivered via nodes 30A and 30B of the network to respectively the A and B sides of the network. There is a 180° phase-difference between the signals at nodes 30A and 30B. Node 22A of the A side of the network is connected to element 102A of the dipole antenna, and node 22B of the network is connected to element 102B of the dipole antenna. Tuning (adjusting) capacitor 35 between the values of 5 pF and 35 pF adjusts the balanced impedance at the dipole elements between 50Ω and 35Ω, respectively for optimizing power coupled into the dipole antenna.

In conclusion, the present invention is described above in terms of several preferred embodiments. The invention, however, is not limited to the embodiments described and depicted herein. Rather, the invention is limited only by the claims appended hereto.

What is claimed is:

1. An impedance-matching network for connecting a plurality of radio-frequency power-sources to a load, the network having an input impedance and an output impedance and the load having a load impedance, the network comprising:

a plurality of radio frequency transmission-lines equal in number to the plurality of radio frequency power sources having a source impedance with each transmission-line connected to a corresponding one of each of the power sources with the transmission lines being connected to the load via a first radio frequency combiner;

each transmission-line including a pair of series connected transmission line sections with each section in the pair having an electrical length of about one-twelfth of a wavelength at an operating frequency of the power-sources; and the series-connection between the transmission-line sections in one transmission line being connected to the series-connection between the transmission-line sections in at least one other transmission-line, said connection including a device having an impedance adjustable within a first predetermined range for matching one of the input and output impedance of the network to respectively one of the source impedance and the load impedance.

2. The impedance matching network of claim 1, wherein the source impedance has a fixed value, the load impedance has a value within a second predetermined range and the adjustable impedance is adjusted such that the output impedance of the network matches the value of the load impedance.

3. The impedance matching network of claim 1 further comprising:

one or more sensors for monitoring characteristics of the network; and a logic module for monitoring the output of the one or more sensors and adjusting the impedance of the adjustable impedance device in response thereto.

4. The impedance matching network of claim 3 wherein the one or more sensors monitor the input voltage and current to the network and the output power of the network.

5. The impedance matching network of claim 3 wherein said device for adjusting the impedance is an array of capacitors that are selectively connected in parallel.

6. The impedance matching network of claim 1, wherein there are two radio frequency sources with phase-difference of 180 degrees between outputs thereof and the adjustable impedance is an adjustable capacitance.

7. The impedance matching network of claim 6, wherein the first radio frequency combiner is a balanced-to-unbalanced transformer.

8. The impedance matching network of claim 1, wherein the load impedance has a fixed value, the source impedance has a value within a second predetermined range and the adjustable impedance is adjusted such that the input impedance of the network matches the value of the source impedance.

9. The impedance matching network of claim 8, wherein there is zero phase-difference between outputs of the plurality of radio frequency sources, and the adjustable impedance device includes a second radio frequency combiner arranged to connect together at a common node the series connections between twelfth-wave transmission line pairs in the plurality thereof with the common node shunted to ground via an adjustable reactance.

10. The impedance matching network of claim 9, wherein there are three radio frequency power sources having about the same output power and three transmission lines, the second radio frequency combiner is a zero-degree three-way combiner formed by a first, second and third sections of transmission line each having an electrical length of about one-twentieth of a wavelength at the operating frequency of the radio frequency sources and the variable reactance is a variable capacitance.

11. The impedance matching network of claim 10, wherein the first radio frequency combiner includes first, second, and third transmission line sections each having an electrical length of about one-half wavelength at the operating frequency of the radio frequency sources, the first half-wave transmission line section being connected in series with the twelfth wave transmission line section pair in a first of the three transmission lines, the second half-wave transmission line section being connected in series with the twelfth wave transmission line section pair in a second of the three transmission lines, with the first, second, and third half-wave transmission line sections being connected at a common node and the common node being connected to the load.

12. The impedance matching network of claim 9, wherein there are two radio frequency power sources having different output power and two transmission lines, one of the two transmission lines having a first transmission line section having an electrical length of one-quarter wavelength at the operating frequency of the radio frequency sources connected between the twelfth-wave transmission line section pair and a first of the two radio frequency sources and the other of the two transmission lines having a second transmission line section having an electrical length of one-quarter wavelength at the operating frequency of the radio frequency sources connected between the twelfth-wave transmission line section pair and the first radio frequency combiner, and wherein the second radio frequency combiner is a zero-degree two-way combiner formed by a first single section of transmission line having an electrical length of about one-twentieth of a wavelength at the operating frequency of the radio frequency sources and the variable reactance includes an inductor in parallel with a variable capacitance.

13. The impedance matching network of claim 12, wherein the first radio frequency combiner is a zero-degree two-way combiner formed by a second single section of transmission line having an electrical length of about one-twentieth of a wavelength at the operating frequency of the radio frequency source.

14. The impedance matching network of claim 9, wherein there are two radio frequency power sources having about the same output power and two transmission lines, the second radio frequency combiner is a zero-degree two-way combiner formed by a first single section of transmission line having an electrical length of about one-twentieth of a wavelength at the operating frequency of the radio frequency sources and the variable reactance is a variable capacitance.

15. The impedance matching circuit of claim 14, wherein the first radio frequency combiner is a zero-degree two-way combiner formed by a second single section of transmission line having an electrical length of about one-twentieth of a wavelength at the operating frequency of the radio frequency sources.

16. The impedance matching network of claim 14, wherein the first radio frequency combiner includes first and second transmission line sections each having an electrical length of about one-half wavelength at the operating frequency of the radio frequency sources, the first half-wave transmission line section being connected in series with the twelfth wave transmission line section pair in one of the transmission lines and the second half-wave transmission line section being connected in series with the twelfth wave transmission line section pair in other of the transmission lines, with the first and second half-wave transmission line sections being connected at a common node and the common node being connected to the load.

17. A method of operating an impedance-matching network for connecting a plurality of radio-frequency power-sources to a load, the network having an input impedance and an output impedance and the load having a load impedance, wherein the network includes a plurality of radio frequency transmission-lines equal in number to the plurality of radio frequency power sources having a source impedance with each transmission-line connected to a corresponding one of each of the power sources with the transmission lines being connected to the load via a first radio frequency combiner and wherein each transmission-line includes a pair of series connected transmission line sections with each section in the pair having an electrical length of about one-twelfth of a wavelength at an operating frequency of the power-sources, said method comprising the steps of:
providing an adjustable impedance bridging the series-connection between the transmission-line sections in one transmission line and the series-connection between the transmission-line sections in at least one other transmission-line; and
adjusting the impedance to match the source impedance to the load impedance.

18. The method of claim 17 further including the steps of:
monitoring the input voltage and current to the network and the output power of the network; and
adjusting the impedance in response to the monitored values.

* * * * *